United States Patent [19]
Xu et al.

[11] Patent Number: 5,856,753
[45] Date of Patent: *Jan. 5, 1999

[54] OUTPUT CIRCUIT FOR 3V/5V CLOCK CHIP DUTY CYCLE ADJUSTMENTS

[75] Inventors: Ping Xu, Kirkland; John W. Kizziar, Seattle, both of Wash.

[73] Assignee: Cypress Semiconductor Corp., San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 624,925

[22] Filed: Mar. 29, 1996

[51] Int. Cl.$^6$ .................................................. H03K 5/13
[52] U.S. Cl. .......................... 327/175; 327/172; 327/292; 327/530; 371/61
[58] Field of Search ..................... 327/175, 172, 327/178, 530, 544, 362, 174, 291, 108, 292, 538; 371/61

[56] References Cited

U.S. PATENT DOCUMENTS

| | | | |
|---|---|---|---|
| 4,365,211 | 12/1982 | Lee | 331/11 |
| 4,479,216 | 10/1984 | Krambeck et al. | 371/61 |
| 4,688,205 | 8/1987 | Abiko | 369/59 |
| 4,723,108 | 2/1988 | Murphy et al. | 323/315 |
| 4,959,557 | 9/1990 | Miller | 327/175 |
| 4,978,905 | 12/1990 | Hoff et al. | 323/314 |
| 5,053,639 | 10/1991 | Taylor | 327/172 |
| 5,079,440 | 1/1992 | Roberts et al. | 327/155 |
| 5,122,676 | 6/1992 | Stewart et al. | 327/172 |
| 5,136,264 | 8/1992 | Nardozza | 332/102 |
| 5,157,355 | 10/1992 | Shikakura et al. | 331/11 |
| 5,254,960 | 10/1993 | Hikichi | 331/46 |
| 5,289,052 | 2/1994 | Ryu | 327/172 |
| 5,367,204 | 11/1994 | Mattison | 327/75 |
| 5,477,180 | 12/1995 | Chen | 327/175 |
| 5,481,228 | 1/1996 | Badyal | 331/74 |
| 5,512,860 | 4/1996 | Huscroft et al. | 331/1 |

*Primary Examiner*—Dinh Le
*Attorney, Agent, or Firm*—Maiorana & Acosta, P. C.; Christopher P. Maiorana

[57] ABSTRACT

The present invention provides an analog biased pre-driver and pad as well as a duty cycle adjustment cell prior to the pre-driver and pad. The pre-driver and pad may operate in either a 3 volt mode, a 5 volt mode or any voltage in between depending only on the power supply voltage present. No production configuration or post-production configuration is required. The present invention utilizes a special bias circuit to reduce the Vcc, temperature and other processing variations. A duty cycle cell produces a range of duty cycles when the circuit is operating between a 3 volt and 5 volt range.

17 Claims, 2 Drawing Sheets

5,856,753

OUTPUT CIRCUIT FOR 3V/5V CLOCK CHIP DUTY CYCLE ADJUSTMENTS

FIELD OF INVENTION

The present invention relates to circuits for maintaining a constant duty cycle in a timing chip and, more particularly, to a circuit for maintaining a constant duty cycle in a timing chip that operates at either 3 volts or 5 volts without the need to preprogram the circuit to work at a specific supply voltage.

BACKGROUND OF THE INVENTION

The trend in integrated circuit (IC) design is to produce circuits that can be operated at reduced power supply voltages (Vcc). Power reduction constraints have reduced the industry standard power supply voltage from 5 volts to 3 volts. However, not every IC only operates at 3 volts. A transition time thus exists where certain chips, such as timing chips, must work with both 3 and 5 volt power supply voltages.

It is desirable to have a low-noise customized clock chip that can work with both 3 volt and 5 volt power supply voltages. A clock duty cycle is measured at 1.4 volts (for a TTL input). A desired duty cycle performance may be, for example, about 50% across process, temperature and voltage ranges for output frequencies up to 140 MHz (5V) or 122 MHz (3V). A desired slew rate may be, for example, between 1 V/ns–2 V/ns. Clock jitter should be relatively low. For example, less than 250 ps jitter is acceptable. Traditional clock drivers may not meet these specifications which may be required for certain modern IC applications.

Some approaches which achieve a 50% duty cycle (measured at 1.4V) at 5 volts implement a pad driver that has a large N-channel pull down transistor. This creates a faster falling time on each clock edge and effectively adjusts the output driver's threshold from 0.5 Vdd to 0.3 Vdd. As a result, a desired duty cycle is achieved when measured at 1.4V which may use a 4.5–5.5 volt power supply voltage. FIG. 1 illustrates a comparison between a pad operating at 5 volts and an otherwise identical pad operating at 3 volts. When the pad above is operating at 3 volts, the rising edge becomes much slower and the measuring point is closer to Vcc. As a result, a very low duty cycle is realized. The precise change in duty cycle depends on the output edge rates. At 5 volts, an excessive amount of noise is produced because the pull-down process is much faster. Tests have shown that the duty cycle produced when the pad is operating at 3 volts may be unacceptable for certain modern IC applications.

Several approaches may realize a 50% duty cycle at both 3 volt and 5 volt operating voltages. One approach uses a programmable element to control a portion of a pull down transistor. This allows the adjustment of the effective output threshold for the desired operating voltage. A major disadvantage of this approach is that the operating voltage must be known while building the programming vectors necessary for the manufacturing of the IC. After the internal fuses of the IC are programmed, the IC typically works only at the specified operating voltage. This tends to increase the complexity of manufacturing as well as the time necessary to generate samples. For example, a manufacturer generally must stock both 3 volt and 5 volt versions of the same part to meet demand.

A second approach may realize a 50% duty cycle at both 3 and 5 volt operating voltages by using an on-chip voltage detector in place of the programmable element. The effect on signal control in the output pull down transistor is the same as in the approach discussed above. However, the second approach provides the advantage of being able to work with either voltage range (e.g., 3.0–3.6V or 4.5–5.5V). One disadvantage of the second approach is that the part tends to operate erratically in the voltage range between 3.6 and 4.5V. This erratic behavior is often directly translated into output jitter. Additionally, it is often difficult to reliably detect a voltage between 3.6 and 4.5 volts under noisy operating conditions.

A third approach may realize a 50% duty cycle at both 3 and 5 volt operating voltages by increasing the edge rates of the output signal. This improves the duty cycle by reducing the time difference between the output threshold voltages. The third approach may be undesirable because a faster edge rate increases the on-chip noise problems and the EMI radiation. The required edge rates for the desired duty cycle performance are three to five times faster than current produce able values. Increased on-chip noise resulting from increasing the edge rates directly increases the part jitter.

A fourth approach realizes a 50% duty cycle at both 3 volt and 5 volt operating voltages by changing the specifications to work around the duty cycle problem. For example, the duty cycle specification may only be met at a lower frequency. This may also be undesirable since conditions under which parts meet duty cycle and other specifications are becoming stricter with time.

SUMMARY OF THE INVENTION

The present invention provides an analog biased pre-driver and pad as well as a duty cycle adjustment cell prior to the pre-driver and pad. The pre-driver and pad may operate in either a 3 volt mode, a 5 volt mode or any voltage in between, depending only on the power supply voltage present. No production configuration or post-production configuration is required. The present invention utilizes a special bias circuit to reduce the Vcc, temperature and other processing variations. A duty cycle cell produces a range of duty cycles when the circuit is operating between a 3 volt and 5 volt range. Based on different supply voltages, the duty cycle is adjusted before the pre-driver and driver. The pre-driver and driver can output a 50% duty cycle for a TTL input regardless the supply voltage Vcc.

The objects, features and advantages of the present invention include providing a clock chip that operates at a constant duty cycle and which does not need reconfiguration. The clock chip works for both 3 volt and 5 volt designs interchangeably without reconfiguration and provides continuous operation over the entire voltage operating range. Consequently, the clock circuit may reduce chip noise and clock jitter at the output, shorten the design cycle, assure a low jitter under all conditions, and achieves a high Power Supply Rejection Ratio (PSRR).

BRIEF DESCRIPTION OF THE DRAWINGS

These and other objects, features and advantages of the present invention will be apparent from the following detailed description and the appended drawings and claims in which:

DETAILED DESCRIPTION OF THE PREFERRED EMBODIMENTS

Figure 1:
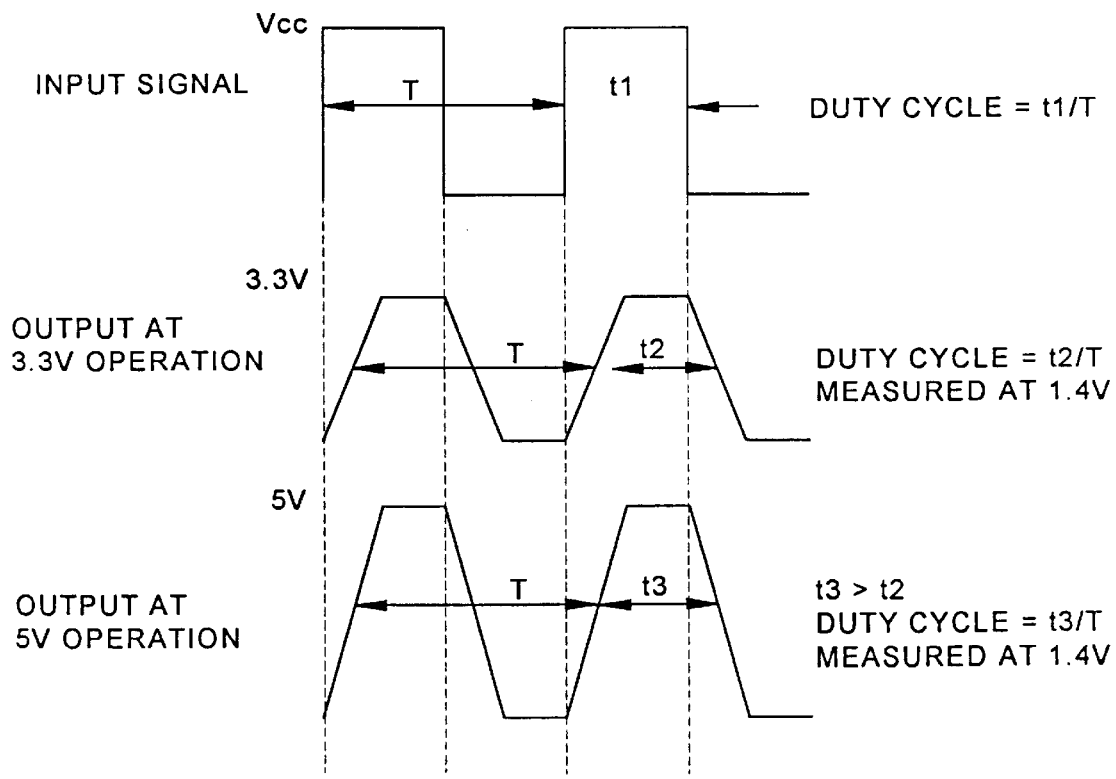
FIG. 1 is a timing diagram illustrating the different duty cycles when a identical clock chip operates at 3 volts and 5 volts.
Figure 2:
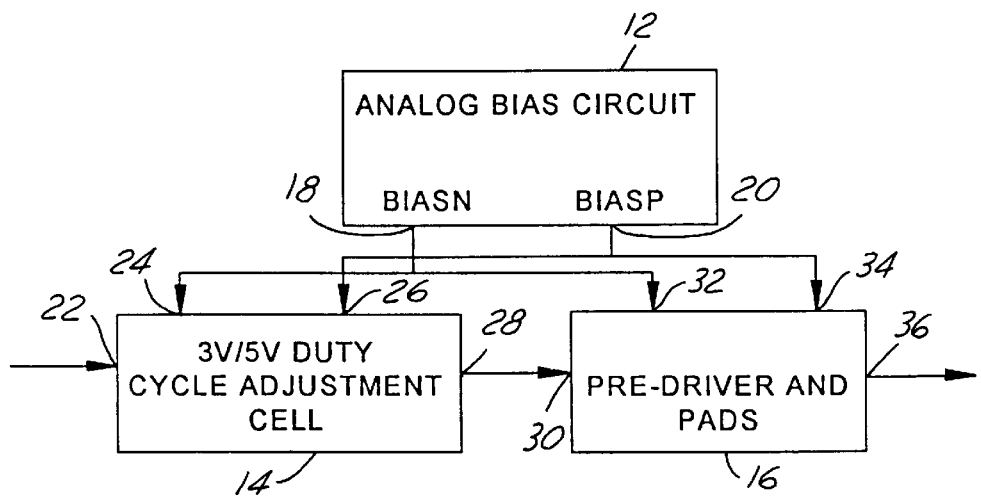
FIG. 2 is a block diagram of a preferred embodiment of the present invention.

Referring to FIG. 2, a block diagram of a circuit 10 is shown in accordance with a preferred embodiment of the present invention. The circuit 10 generally comprises an analog bias circuit 12, a duty cycle adjustment cell 14 and a pre-driver and optional pad circuit 16. The analog bias circuit 12 has an output 18 that provides a biasN signal to the duty cycle adjustment cell 14 and to the pre-driver and pad circuit 16. The analog bias circuit 12 also has an output 20 that provides a biasP signal to the duty cycle adjustment cell 14 and to the pre-driver and pad circuit 16. The duty cycle adjustment cell 14 has an input 22 that receives a 50% duty cycle signal (measured at Vcc/2), an input 24 that receives the biasN signal and an input 26 that receives the biasP signal. The duty cycle adjustment cell 14 presents an output 28 that is received at an input 30 of the pre-driver and pad circuit 16. The pre-driver and pad circuit 16 also has an input 32 that receives the biasN signal and an input 34 that receives the biasP signal. The pre-driver and pad circuit 16 presents an output 36 that produces a 50% duty cycle signal measured at 1.4 volts. The supply voltage to the circuit may be, in one example, at least 2.7v and may, in one example, range from about 3 to about 5v, and in another example, may range from 2.7v to about 6v.

In the present application, a "50% duty cycle signal" refers to a desired duty cycle signal which in its most preferred embodiment, is about 50%. However, it may be any desired level, for example, from 30% to 70%, and more preferably, from about 40% to 60%.

The duty cycle adjustment cell 14 may provide an adjustment to the signal received at the input 22. At 5v operation, the duty cycle adjustment cell 14 outputs a much lower duty cycle signal at the output 28 because of a very fast falling edge. After the pre-driver and pad 16, the output duty cycle signal will be larger (measure at 1.4v) than the duty cycle at the input since the internal duty cycle is measured at Vcc/2. The duty cycle at the output 28 may be lower so the duty cycle at the output 36 can be 50%. The analog bias circuit 12 provides the output 18 and the output 20 that may provide adjustments for temperature and other processing parameter variations in the operation of the circuit 10. Any type of analog bias circuit 12 that produces process temperature and Vcc self-compensation may be used.

Figure 3:
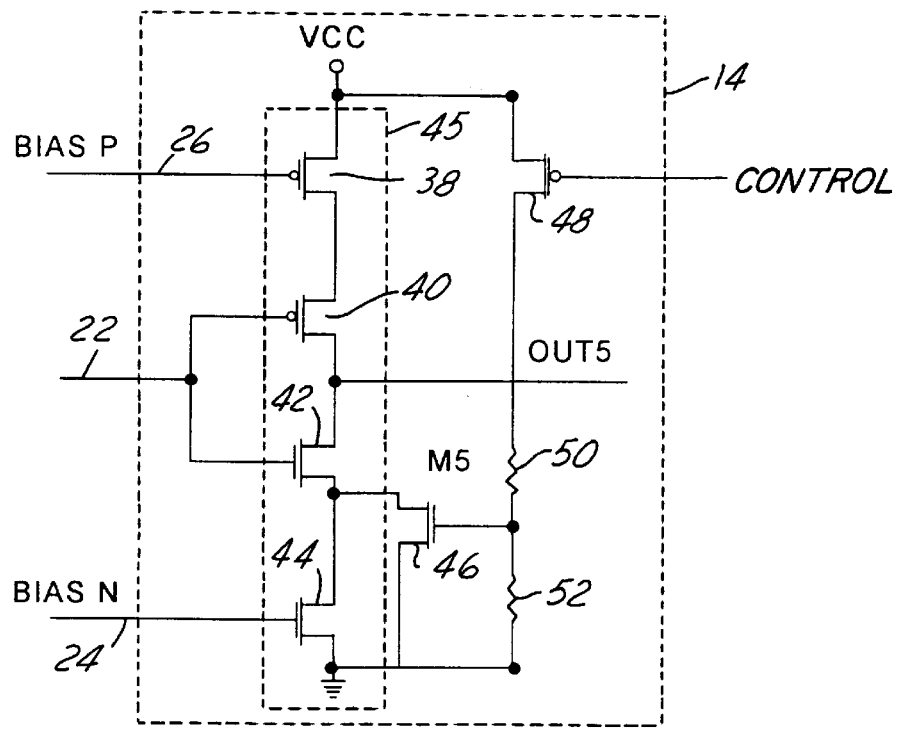
FIG. 3 is a circuit diagram illustrating a duty cycle adjustment cell.

Referring to FIG. 3, the duty cycle adjustment cell 14 is shown in greater detail. The duty cycle adjustment cell 14 generally comprises a transistor 38, a transistor 40, a transistor 42, a transistor 44, a transistor 46, a transistor 48, a resistor 50 and a resistor 52. The resistors 50 and 52, in one example, have a 2:1 ratio. The transistors 38, 40, 42 and 44 form an input section 45. A supply voltage Vcc is presented to the sources of the transistors 38 and 48. The drains of the transistors 44 and 46 are connected to ground. An inverted gate of the transistor 38 receives the biasP signal present at the input 26. The drain of the transistor 38 is coupled to the source of the transistor 40. An inverted gate of the transistor 40 as well as a gate of the transistor 42 each receives the signal from the input 22. The drain of the transistor 40 and the source of the transistor 42 are coupled together and presented as the output 28. The drain of the transistor 42 is coupled to the source of the transistor 44 and the source of the transistor 46. The base of the transistor 44 receives the biasN signal from the input 24. The drain of the transistor 48 is connected to a first side of the resistor 50. A second side of the resistor 50 is coupled to the gate of the transistor 46 as well as to a first side of the resistor 52. A second side of the resistor 52 is coupled to ground.

The transistor 46 may skew (or change the rate of) the duty cycle of the signal received at the input 22 based on the value of Vcc. The transistor 44 receives the biasN signal from the input 22 and operates to provide adjustments for process and temperature variations as needed and/or desired. The resistors 50 and 52 are used in combination to provide a proper input voltage (for example, about 1/3 Vcc) to the transistor 46. The transistor 48 provides a power-on switch that may be used to prevent leakage when the circuit 10 is not operating. The transistor 48 may receive a control input (e.g., CONTROL) that enables the duty cycle adjustment circuit 14 when the control unput is at a first digital state and disables the duty cycle adjustment circuit 14 when the control input is at a second digital state. In a power-down mode, there is no DC current in the circuit 10. The transistor 46 turns on much faster at a 5 volt operation than it does at a 3 volt operation. Specifically, the gate voltage of the transistor 46 (node VrefM5) is much higher at the 5 volt operating voltage. As a consequence, the output duty cycle of the duty cycle adjustment cell 14 is much lower at the 5 volt operation. At 5v, a 50% duty cycle input to the pre-driver and pad 16 will result in a higher duty cycle (>50% measured at 1.4v)

Figure 4:
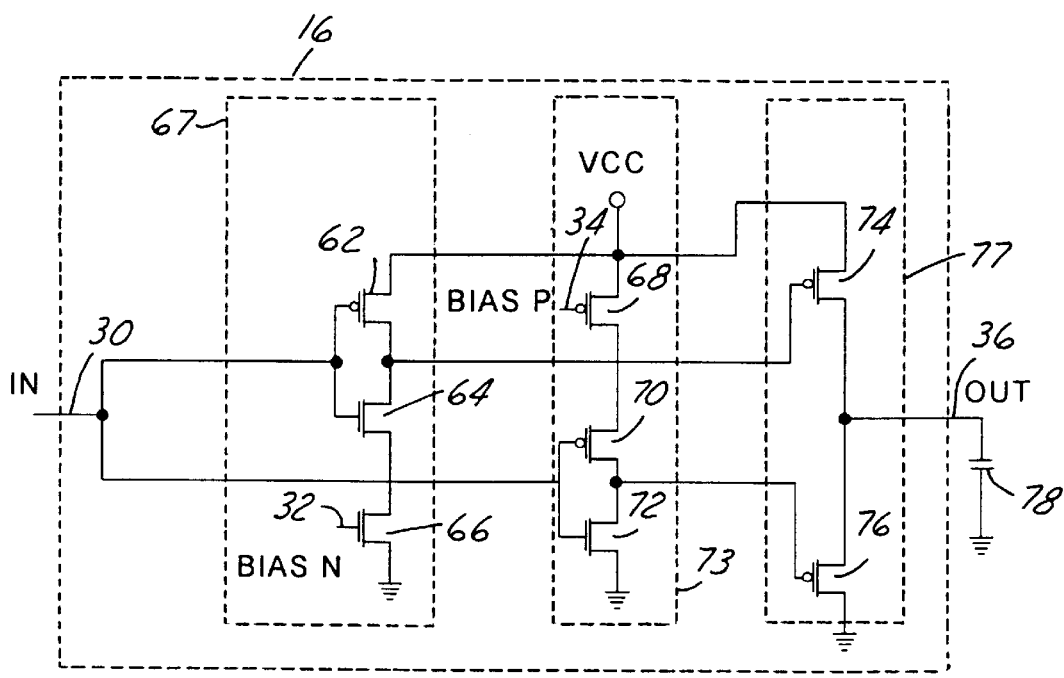
FIG. 4 is a circuit diagram illustrating the pre-driver and pad.

Referring to FIG. 4, the pre-driver and pad circuit 16 is shown in greater detail. The pre-driver and pad circuit 16 generally comprises a transistor 62, a transistor 64, a transistor 66, a transistor 68, a transistor 70, a transistor 72, a transistor 74 and a transistor 76. The transistors 62, 64 and 66 form a pull-up pre-driver section 67. The transistors 68, 70 and 72 form a pull-down pre-driver section 73. The transistors 74 and 76 form a output driver section 77. An inverted gate of the transistor 68 receives the biasP signal from the input 34. A gate of the transistor 66 receives the biasN signal from the input 32. The input signal 30 is presented to an inverted gate of the transistor 62, a gate of the transistor 64, an inverted gate of the transistor 70 and a gate of the transistor 72. An input voltage Vcc is presented to the source of the transistor 62, the source of the transistor 68 and the source of the transistor 74. The drain of the transistor 62 is coupled to the drain of the transistor 64 as well as to an inverted gate of the transistor 74. The drain of the transistor 64 is coupled to the gate of the transistor 66. The drain of the transistor 68 is coupled to the source of the transistor 70. The drain of the transistor 70 is coupled to the drain of the transistor 72 as well as to the gate of the transistor 76. The drain of the transistor 74 is coupled to the source of the transistor 76 and also presents the output 36. The source of the transistor 66, the transistor 72 and the transistor 76 are each coupled to ground. The output 36 is presented across a capacitor 78.

The pre-driver and pad circuit 16 may drive a 30 pF load at the capacitor 78. Other capacitances can be used for the capacitor 78 to fit the design criteria of a particular application. The speed that the pre-driver and pad circuit 16 operates may be controlled by the biasN signal and the biasP signal. Specifically, at higher voltage, lower temperature and faster process conditions, the biasP signal increases while the biasN signal decreases. This allows the pull-up and pull-down pre-driver circuits 67 and 73 to produce slower pull-up and pull-down signals. This prevents the buffer from providing too fast of a signal at the output 36. An additional advantage of the adjustment provided by the biasN signal and the biasP signal is that noise may be kept to a minimum under a wide variety of conditions.

The circuit 10 may provide a duty cycle adjustment that produces a 50% duty cycle output signal with any input supply voltage (for example, at least 2.7v, preferably 2.7–6v, more preferably from about 3 to about 5 volts) without any production configuration (i.e., producing both 3 and 5 volt parts) or post-production configuration. Additionally, the circuit 10 can be extended to operate with even greater input voltages. The 3 and 5 volt examples used herein reflect the 3 volt and 5 volt industry standards in current production, as well as 50% duty cycle. The present invention reduces manufacturing overhead by allowing a single device to be used in a variety of applications.

While the invention has been particularly shown and described with reference to the preferred embodiments thereof, it will be understood by those skilled in the art that various changes in form and details may be made without departing from the spirit and scope of the invention.

We claim:

1. A circuit comprising:
   a first circuit configured to generate at least one bias signal in response to a supply voltage; and
   a second circuit configured to provide an output timing signal in response to (i) an input timing signal having a duty cycle and (ii) said at least one bias signal, wherein said second circuit comprises a (i) plurality of transistors connected between said supply voltage and ground configured to receive said input timing signal and said at least one bias signal and to generate said output timing signal having a constant duty cycle and (ii) an adjustment transistor coupled to said plurality of transistors and having a gate connected to a junction between a first resistor and a second resistor, said second resistor coupled between said junction and ground, said first resistor coupled between said supply voltage and said junction, wherein said second circuit skews the duty cycle of said input timing signal in response to said at least one bias signal to generate said output timing signal.

2. The circuit according to claim 1, further comprising:
   a third circuit configured to receive (i) said output timing signal and (ii) said at least one bias signal, said third circuit decreases a sensitivity of said output timing signal as a function of said supply voltage.

3. The circuit of claim 2 wherein said third circuit comprises a pre-driver.

4. The circuit according to claim 1 wherein said at least one bias signal having a magnitude responding to variations in said supply voltages.

5. The circuit according to claim 4 wherein said second circuit skews said duty cycle in response to said fixed magnitude of said at least one bias signal.

6. The circuit according to claim 1 wherein said second circuit further comprises a controlling transistor connected between said supply voltage and said first resistor, said controlling transistor having a control input that enables said controlling transistor when said control input is at a first digital state and disables said controlling transistor when said control input is at a second digital state.

7. The circuit according to claim 6 wherein said controlling transistor comprises a CMOS transistor.

8. The circuit according to claim 3, wherein said first circuit comprises an analog bias circuit configured to generate said at least one bias signal, wherein said at least one bias signal provides a reference voltage.

9. The circuit of claim 1 wherein said supply voltage is at least about 2.7 volts.

10. The circuit according to claim 1 wherein said supply voltage ranges from about 2.7 volts to about 6 volts.

11. The circuit according to claim 1 wherein said supply voltage ranges from about 3 to about 5 volts.

12. The circuit according to claim 8 wherein said pre-driver further comprises a pre-driver output section for buffering said constant duty cycle timing signal output.

13. The circuit according to claim 2, wherein said third circuit comprises a pull-up per-driver coupled between said supply voltage and said output timing signal.

14. The circuit according to claim 1 wherein said third circuit further comprises a pull-down pre-driver coupled between around and said output timing signal.

15. A method for producing a constant duty cycle for an input timing signal comprising the steps of:
    (a) generating at least one bias signal in response to a supply voltage; and
    (b) skewing a duty cycle of said input timing signal to produce an output timing signal having said constant duty cycle and a reduced sensitivity to variations in said supply voltage, wherein said skewing is generated in response to a (i) plurality of transistors connected between said supply voltage and ground configured to receive said input timing signal and said at least one bias signal and to generate said output timing signal having said constant duty cycle and (ii) an adjustment transistor coupled to said plurality of transistors and having a date connected to a junction between a first resistor and a second resistor, said second resistor coupled between said junction and ground, said first resistor coupled between said supply voltage and said junction, wherein said second circuit skews the duty cycle of said input timing signal in response to said at least one bias signal to generate said output timing signal.

16. The method of claim 15 further comprising the step of generating a driver output in response to said output timing signal.

17. The method according to claim 15 further comprising the step of deriving a reference voltage having a fixed magnitude from said supply voltage.

* * * * *